March 17, 1970 S. C. LUKENS, JR 3,501,705
PHASE-LOCK LOOP FM DETECTOR CIRCUIT EMPLOYING A PHASE COMPARATOR AND KEYED OSCILLATOR
Filed Sept. 27, 1967 2 Sheets-Sheet 1

INVENTOR.
SAMUEL C. LUKENS, JR.
BY Peter Xiarhos
AGENT.

March 17, 1970 S. C. LUKENS, JR 3,501,705
PHASE-LOCK LOOP FM DETECTOR CIRCUIT EMPLOYING A PHASE
COMPARATOR AND KEYED OSCILLATOR
Filed Sept. 27, 1967 2 Sheets-Sheet 2

INVENTOR.
SAMUEL C. LUKENS JR.

BY Peter Xiarhos
AGENT.

United States Patent Office 3,501,705

Patented Mar. 17, 1970

3,501,705

PHASE-LOCK LOOP FM DETECTOR CIRCUIT EMPLOYING A PHASE COMPARATOR AND KEYED OSCILLATOR

Samuel C. Lukens, Jr., Needham, Mass., assignor to Sylvania Electric Products Inc., a corporation of Delaware Filed Sept. 27, 1967, Ser. No. 670,984
Int. Cl. H03b 3/06; H03d 3/24, H03k 3/26
U.S. Cl. 329—122 10 Claims

ABSTRACT OF THE DISCLOSURE

Phase-lock loop FM detector circuit comprising a coincidence-gate phase comparator including first and second input terminals and an output terminal, an integrator coupled in series to the output terminal, and a feedback loop including a keyed astable multivibrator coupled between the output terminal and the second input terminal. The phase comparator senses the phase difference between an output signal provided by the multivibrator and an input FM signal applied to the first terminal, and generates a multivibrator trigger signal. A new output signal which is altered in frequency and phase in accordance with the phase difference between the compared signals is provided by the multivibrator and applied to the phase comparator. In response to the new multivibrator output signal, the frequency and phase of the output signal of the phase comparator is altered thereby keeping the output signal of the multivibrator phase-locked to the input FM signal. The output signal of the phase comparator is integrated by the integrator to provide a replica of the modulation on the input signal.

Background of the invention

The present invention relates to phase-lock loop circuits and, more particularly, to phase-lock loop FM detector circuits amenable to fabrication by presently-available integrated circuit techniques.

In recent years, with the evolution of monolithic integrated circuit techniques wherein an entire electronic circuit may be placed on a tiny chip of semiconductor material, it has been found desirable and advantageous to manufacture a wide variety of conventional discrete-component electronic circuits in an integrated circuit form. Such integrated circuits require little space, are potentially inexpensive, reliable, and offer other advantages over the conventional circuits employing discrete components.

The present monolithic integrated circuit technology, however, is not without its limitations. For example, it is not practicable to fabricate inductive components, such as coils or transformers, by using existing integrated circuit techniques. Additionally, resistive and capacitive elements having large values are difficult to fabricate because of relatively great space requirements, problems in the physical layout of the elements on a chip, and because of the increased probability of the presence of defects such as pinholes as the value of resistance or capacitance is increased. Heretofore, the inability to integrate inductive devices and to satisfactorily fabricate large-valued capacitive and resistive elements has been overcome by fabricating as many elements of a particular circuit as possible by integrated circuit techniques and by externally connecting such elements with the remaining non-integratable elements of the circuit, either by direct physical connections or, in the case of resistive and capacitive elements, by coupling the integrated elements with thick film resistive and capacitive elements. However, where this "outboarding" has been accomplished, many of the advantages of integrated circuit technology have been minimized or negated.

A typical application in which monolithic circuits containing no inductive elements or large-valued resistive and capacitive elements would be desirable is as a phase-lock loop detector circuit for high-fidelity FM radio and television receivers. One phase-lock loop FM detector circuit presently known to applicant which can be integrated by known integrated circuit techniques and which includes no inductive elements comprises a coincidence-gate phase comparator, a voltage-controlled oscillator, a low-pass audio output filter, and a feedback loop including an emitter follower and an RC low-pass filter or integrator.

In the above-described phase-lock loop FM detector circuit, the voltage-controlled oscillator is kept phase-locked to an incoming frequency-modulated RF carrier signal by means of the coincidence-gate phase comparator and the feedback loop. More specifically, as the frequency of the incoming RF carrier signal changes due to the frequency modulation, the coincidence-gate phase comparator senses the difference in phase between the incoming carrier signal and the voltage-controlled oscillator output signal, and generates a control or error voltage signal which is integrated by the low-pass filter to provide a direct current signal. The direct current signal is applied to the voltage-controlled oscillator the frequency and phase of which are altered in response to the direct current signal to keep the oscillator output signal locked to the incoming carrier signal. The control or error voltage signal is also applied to the low-pass audio output filter which removes the RF carrier and provides a replica of the modulation on the carrier.

While the above-described phase lock loop FM detector circuit can be fabricated by existing integrated circuit techniques, a general disadvantage of the detector circuit is that the RC low-pass filter or integrator employed in the feedback loop comprises a capacitive element and a resistive element having relatively large values. For example, the capacitive element included in the integrator of the above-described FM detector circuit may typically have a value of 500 picofarads; the resistive element included in the integrator may typically have a value of 15,000 ohms. Because of the relatively large values of the capacitive and resistive elements constituting the low-pass filter, the area of a chip required to integrate such elements is significantly large. Accordingly, the number of circuits which may be fabricated on a single chip is reduced and the cost per circuit is increased. Furthermore, the probability of the existence of pinhole defects and accompanying reduced yield is increased.

Summary of the invention

Briefly, the phase-lock loop circuit of the present invention comprises a phase comparator means and a keyed oscillator means. The phase comparator means further includes a first input terminal means for receiving an input signal, a second input terminal means, and an output terminal means. The keyed oscillator means is coupled between the output terminal means and the second input terminal means of the phase comparator means and is operable to provide an output signal to the second terminal means of the same frequency as the input signal but phase-displaced therefrom. In operation, the phase comparator compares the input signal with the output signal of the keyed oscillator means and provides an output at the output terminal means having either a first condition or a second condition. The duration for which the output of the phase comparator means has the first condition is determined essentially by a delay present in the keyed oscillator means. The duration for which the output of the phase comparator means has the second condition is determined by the degree of displacement between the input signal and the output signal of the keyed oscillator means.

As the frequency of the input signal changes, the new input signal is compared in the phase comparator means with the output signal of the keyed oscillator means, and an output representative of the degree of phase displacement is provided by the phase comparator means to the keyed oscillator means. The duration of the first and second conditions are determined in the same manner as previously described. In response to the output of the phase comparator means, the keyed oscillator generates a new output signal having its frequency and phase altered by an amount in accordance with the phase displacement between the compared signals. In the above-described manner, the output signal of the keyed oscillator means is kept phase-locked to the new input signal.

When the above-described phase-lock loop circuit is combined with an integrator which intergrates the output provided by the phase comparator means, and the input signal is a frequency-modulated carrier signal, the integrated output of the integrator represents a replica of the frequency modulation.

Description of the preferred embodiment

Figure 1:
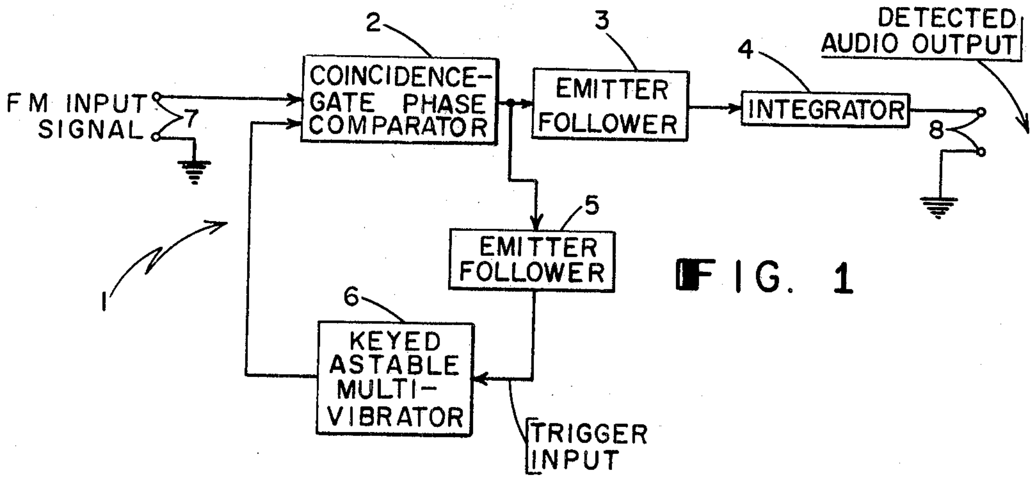
FIG. 1 is a block diagram illustrating a phase-lock loop FM detector in accordance with the present invention.

Referring to FIG. 1, there is shown at 1 a block diagram of the phase-lock loop FM detector of the present invention. As shown therein, the FM detector 1 comprises a coincidence-gate phase comparator 2, a first emitter follower 3, an integrator 4, a second emitter follower 5, and a keyed astable multivibrator or oscillator 6. A frequency-modulated RF carrier input signal is applied to the coincidence-gate phase comparator 2 at a pair of input terminals 7. The detected audio output signal is provided at a pair of output terminals 8.

The operation of the FM detector of FIG. 1 is as follows. When the center frequency of a carrier (no FM on the carrier) is applied to the terminals 7 of the coincidence-gate phase comparator 2, the keyed astable multivibrator 6 generates a signal having the same frequency as the input signal but phase-displaced therefrom by 90°. The coincidence-gate phase comparator 2 is adapted to compare the phase of the input carrier signal with the phase of the output signal of the keyed astable multivibrator 6. If both the carrier input signal and the output signal of the keyed astable multivibrator 6 are at a high voltage level, the output provided by the coincidence-gate phase comparator 2 to the integrator 4 and to the keyed astable multivibrator 6 is at a low voltage level. If only one of the input signals thereto is high and the other signal is low, or both signals are low, the output provided by the coincidence-gate phase comparator 2 is high. The output signal provided by the coincidence-gate phase comparator 2 to the integrator 4 via the emitter follower 3 is integrated by the integrator 4 to provide a signal representative of the difference in phase between the input signal and the output signal of the keyed astable multivibrator 6. The emitter follower 3 provides a high impedance at the output of the coincidence-gate phase comparator 2 and a low impedance at the input of the integrator 4.

As the frequency of the carrier input signal changes while the keyed astable multivibrator 6 provides an output signal of the same frequency as before, the times during which either or both the input signal and the output signal of the keyed astable multivibrator 6 are high also change. Accordingly, the frequency and the phase displacement of the output signal of the coincidence-gate phase comparator 2 changes. In the case of an increase in frequency, the percentage of time each cycle during which the input signal and the keyed astable multivibrator output signal are both high increases; the percentage of time each cycle during which one of the signals is high and the other is low decreases. In the case of a decrease in frequency, the percentage of time each cycle during which the input signal and the keyed astable multivibrator output signal are high decreases; the percentage of time each cycle during which one of the signals is high and the other is low increases.

The output signal provided by the coincidence-gate phase compartor 2 as a result of comparing the output signal of the keyed astable multivibrator 6 with the new input signal is applied to the trigger input of the keyed astable multivibrator 6 via the emitter follower 5. The emitter follower 5 serves as a buffer amplifier and isolates the output of the coincidence-gate phase comparator 2 from the trigger input of the keyed astable multivibrator 6. More particularly, the emitter follower 5 provides a high impedance at the output of the coincidence-gate phase comparator 2 and a low impedance at the input of the keyed astable multivibrator 6. The output trigger signal of the coincidence-gate phase comparator 6 causes the keyed astable multivibrator 6 to change state whereby the frequency and phase of its oscillations are changed by an amount in according with the change in the frequency of the input signal.

The output signal of the keyed astable multivibrator 6 is applied to the coincidence-gate comparator 2 to alter the frequency of the output signal therefrom by an amount sufficient to lock the output signal of the keyed astable multivibrator 6 to the input signal. The output signal of the coincidence-gate phase comparator 2, after each phase comparison, is applied to the integrator 4 via the emitter follower 3 which provides the detected audio output signal representative of the modulation on the RF carrier. The amplitude of the detected output varies with the extent of the phase displacement between the input signal and the output signal of the keyed astable multivibrator 6. Specifically, the amplitude of the detected output decrease with increases in the frequency of the input signal, and increases with decreases in the frequency of the input signal.

Figure 2:
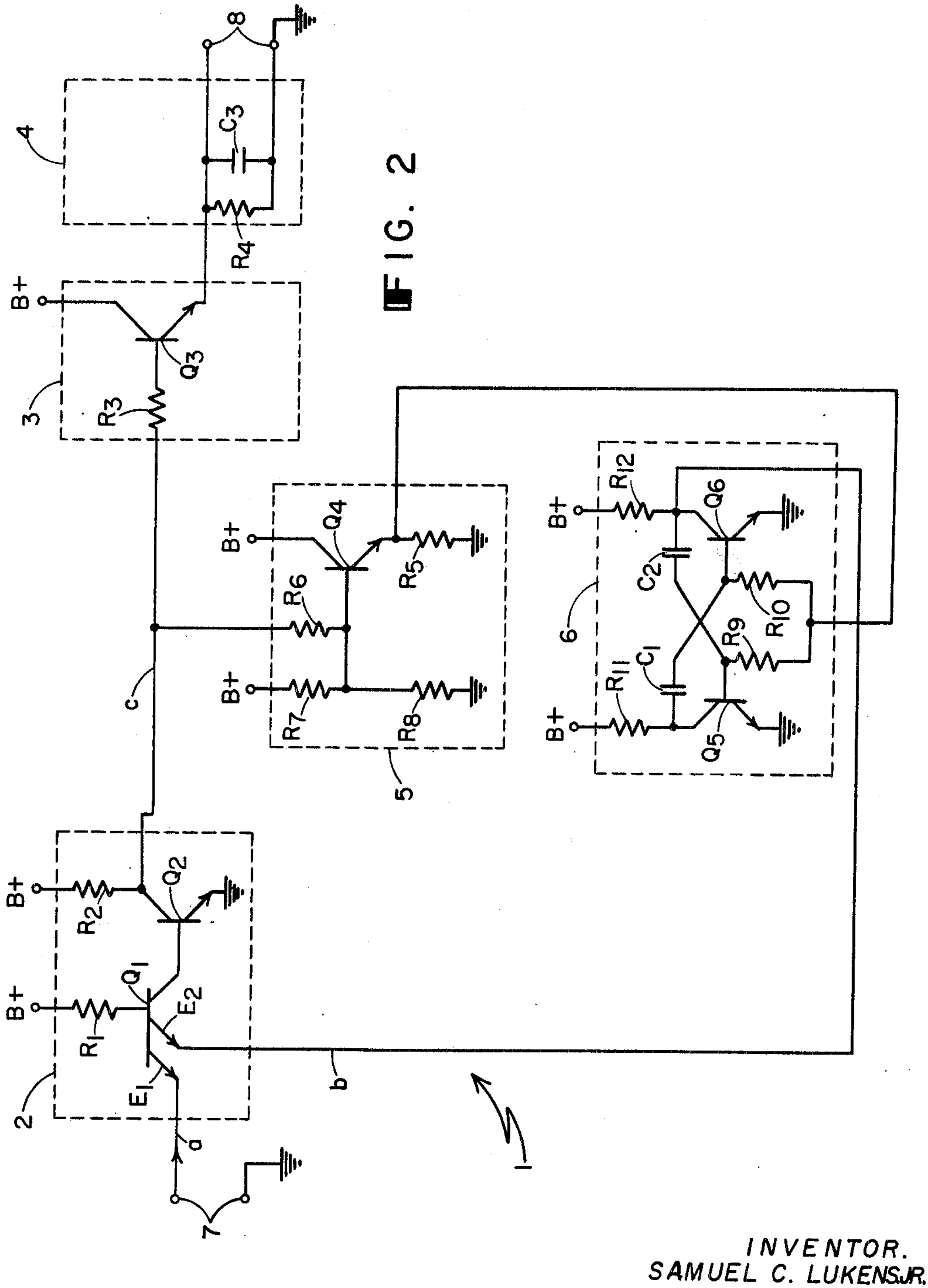
FIG. 2 is a detailed schematic circuit diagram of the phase-lock loop FM detector shown in FIG. 1.

FIG. 2 illustrates in detail the FM detector circuit 1 shown in block diagram form in FIG. 1. As shown in FIG. 2, the coincidence-gate phase comparator 2 comprises an NPN input transistor $Q_1$ having a paiar of emitters $E_1$ and $E_2$, an NPN inverter transistor $Q_2$, a resistor $R_1$ connected to the base of the transistor $Q_1$ and to a source of potential B+, and a resistor $R_2$ connected to the collector of the transistor $Q_2$ and to the source of potential B+. The coincidence-gate phase comparator 2 is adapted to function as a TTL (Transistor-Transistor Logic) NAND gate. That is, the output of the coincidence-gate phase comparator 2, appearing at the collector the transistor $Q_2$, is low when both input signals to the emitters $E_1$ and $E_2$ are high, and high when both inputs are low, or either input is high and the other input is low. More particularly, when the inputs to the emitters $E_1$ and $E_2$ are both high, current flows from the collector of the transistor $Q_1$ to the base of the transistor $Q_2$. The signal of the base of the transistor $Q_2$ is inverted by the transistor $Q_2$ to provide a low signal at the collector thereof. When either one of the emitters $E_1$ and $E_2$ is high and the other low, or both of the emitters $E_1$ and $E_2$ are low, no current appears at the base of the transistor $Q_2$ and a high output is provided by the inverter transistor $Q_2$ at the collector thereof.

The output signal of the coincidence-gate phase comparator 2 is applied to the emitter follower 3 and to the emitter follower 5. The emitter follower 3 comprises an NPN transistor $Q_3$ directly connected to the B+ supply via the collector thereof, and an isolation resistor $R_3$ connected to the collector of the inverter transistor $Q_2$ and to the base of the transistor $Q_3$. The resistor $R_3$ and the transistor $Q_3$ serve to provide a low impedance at the input of the integrator 4. The integrator 4 comprises a resistor $R_4$ connected between the emitter of the transistor $Q_3$ and ground potential, and a capacitor $C_3$ connected across the resistor $R_4$. The resistor $R_4$ and the capacitor $C_3$ serve to integrate the signal provided by the emitter of the transistor $Q_3$ and to provide the detected output signal corresponding to the phase difference between the input signal and the output signal of the keyed astable multivibrator 6 and representative of the frequency modulation on the RF carrier input signal.

The emitter follower 5 comprises an NPN transistor $Q_4$ directly connected to the B+ supply via the collector thereof, an isolation resistor $R_5$ connected between the emitter of the transistor $Q_4$ and ground potential, an impedance-matching resistor $R_6$ connected between the collector of the inverter transistor $Q_2$ and the base of the transistor $Q_4$, and a pair of series-connected resistors $R_7$ and $R_8$ connected between the B+ supply and ground potential. As mentioned previously, the emitter follower 5 provides a high impedance at the output of the coincidense-gate phase comparator 2 and a low impedance at the input of the keyed astable multivibrator 6. The resistors $R_7$ and $R_8$ have values chosen to provide a direct current voltage signal at the input of the keyed astable multivibrator 6 which will set the nominal frequency of oscillation of the keyed astable multivibrator 6 to the center frequency of the RF carrier to be demodulated. If desired, the resistors $R_7$ and $R_8$ may be replaced by an external variable potentiometer which would provide for varying the frequency of the keyed astable multivibrator 6.

The keyed astable multivibrator 6 comprises a pair of grounded-emitter NPN transistors $Q_5$ and $Q_6$. The base of the transistor $Q_5$ is coupled to the emitter of the transistor $Q_4$ of the emitter follower 5 through a resistor $R_9$ and to the collector of the transistor $Q_6$ through a capacitor $C_2$. The base of the transistor $Q_6$ is coupled to the emitter of the transistor $Q_4$ via a resistor $R_{10}$ and to the collector of the transistor $Q_5$ through a capacitor $C_1$. The collectors of the transistors $Q_5$ and $Q_6$ are coupled to the B+ supply by means of resistors $R_{11}$ and $R_{12}$, respectively.

The detailed operation of the phase-lock loop FM detector of FIG. 2 will now be described in conjunction with FIGS. 3(*a*) through 3(*c*) and 4(*a*) through 4(*c*). The letters *a*, *b*, and *c* designating the voltage waveforms of FIGS. 3 and 4 correspond to the points in the FM detector of FIG. 2 at which such voltage waveform appear.

Figure 3:
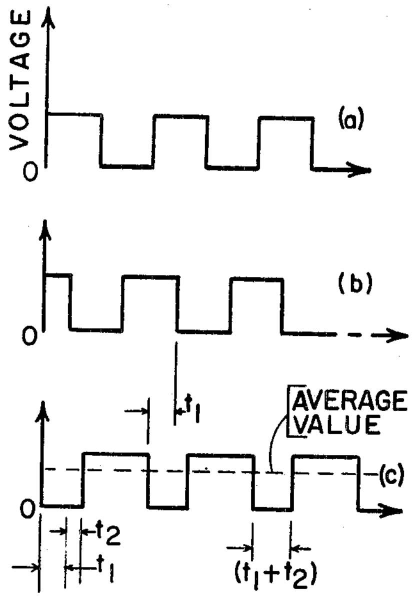
FIGS. 3(*a*) through 3(*c*) are idealized voltage waveforms at various points in the FM detector showing the operation of the detector under steady-state, center frequency conditions (no FM on the carrier)

A constant-amplitude center-frequency of a carrier signal, such as shown in FIG. 3(*a*), is applied to the input terminals 7 associated with the coincidence-gate phase comparator 2. More particularly, the carrier input signal is applied between the emitter $E_1$ of the transistor $Q_1$ (at *a*) and ground potential. In an FM receiver, the input signal would typically be generated by the output of a limiter stage. The output signal of the keyed astable multivibrator 6 is applied to the emitter $E_2$ of the transistor $Q_1$. As mentioned previously, and as shown in FIG. 3(*b*), the output of the astable multivibrator 6 has the same frequency as the input signal under steady-state conditions but phase-displaced therefrom by 90°.

As shown in FIG. 3(*c*), the output of the coincidence-gate phase comparator 2 is low when both the input signal (FIG. 3(*a*)) and the output signal of the keyed astable multivibrator 6 (FIG. 3(*b*)) are high. It may further be noted, and as will become more fully apparent hereinafter, the output of the concidence-gate phase comparator 2 is low for an additional period of time equal to $t_2$ due to the saturation time of the transistor $Q_2$. The output of the coincidence-gate phase comparator 2 is high when both signals are low, or when one of the signals is high and the other signal is low. The output signal of the coincidence-gate phase comparator 2, as a result of comparing the phases of the input signal and the output signal of the keyed astable multivibrator 6, is coupled by the emitter follower 5 to the resistors $R_9$ and $R_{10}$ of the keyed astable multivibrator 6. The signal applied to the resistors $R_9$ and $R_{10}$ acts as a trigger for the keyed astable multivibrator 6 and affects a reversal in the conduction states of the transistors $Q_5$ and $Q_6$ included therein. Reversals in the conducting states of the transistors $Q_5$ and $Q_6$ of the keyed astable multivibrator 6 are initiated by the negative-going transition from high to low of the output of the coincidence-gate phase comparator 2 (FIG. 3(*c*)). However, as indicated in FIG. 3(*b*), state reversals of the transistors $Q_5$ and $Q_6$ of the keyed astable multivibrator 6 do not take place immediately, but rather after a period of delay equal to $t_1$.

The period of $t_1$ represents the duration of the saturation time of the transistor $Q_6$. The effect of the delay $t_1$ is such that at the moment a high level signal is applied to the keyed astable multivibrator 6 by the coincidence-gate phase comparator 2, the keyed astable multivibrator transistor $Q_6$ is deep in saturation for a period of time $t_1$ and cannot change its state instantaneously, but only after the period of time $t_1$ has passed. It may further be noted from FIGS. 3(*a*) and 3(*b*), that the period of delay $t_1$ establishes the 90° phase shift between the input input signal, FIG. 3(*a*), and the output signal of the keyed astable multivibrator 6, FIG. 3(*b*). The value of $t_1$ is fixed by conventional integrated circuit techniques relating to the fabrication of transistors.

It may further be noted from FIGS. 3(*a*) through 3(*c*) that the output of the coincidence-gate phase comparator 2 (FIG. 3(*c*)) returns to the high state when the output signal of the keyed astable multivibrator 6 (FIG. 3(*b*)) goes low. However, as indicated in FIG. 3(*c*), the output of the coincidence-gate phase comparator 2 does not immediately go high but rather only after a period of delay $t_2$. This period of delay $t_2$, although not critical to the operation of the invention, exists for the reason that when the output of the keyed astable multivibrator goes low (at point *b*), the transistor $Q_2$ is deep in saturation and, because of the inherent delay, cannot change state until a time $t_2$ has expired. Thus, it is evident from FIG. 3(*c*) that the time during which the coincidence-gate phase comparator output is low is fixed at a value equal to the combined delay periods $t_1$ and $t_2$. Since the transistor $Q_1$ is never in saturation, the transistor $Q_1$, therefore, does not contribute to the combined time delay ($t_1$ plus $t_2$). Also, while the transistor $Q_4$ of the emitter follower 5 is in saturation at some time, the duration of such saturation time is negligible when compared with $t_1$ or $t_2$.

At the same time as the output signal of the concidence-gate phase comparator 2 is applied to the keyed astable multivibrator 6, the output signal is also applied to the integrator 4 via the emitter follower 3 and integrated by the $R_4$–$C_3$ combination. The demodulated audio output is taken across the capacitor $C_3$ and the output terminals 8. The average value of the signal appearing across the capacitor $C_3$ is shown by a dotted line in FIG. 3(*c*).

Figure 4:
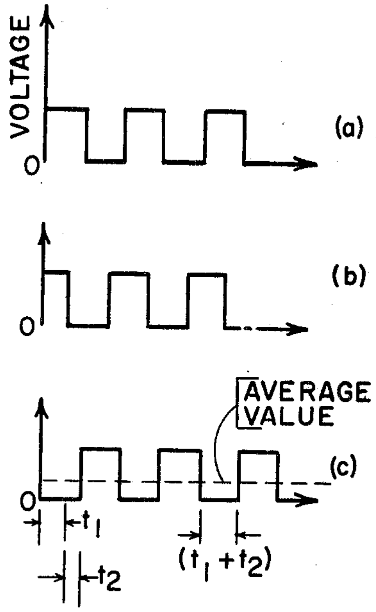
FIGS. 4(*a*) through 4(*c*) are idealized voltage waveforms at the same points showing the operation of the detector with a frequency-modulated carrier.

If the input signal applied to the input terminals 7 increases in frequency as indicated in FIG. 4(*a*) due to the frequency modulation, the phase relationships between the input signal and the output signal of the keyed astable multivibrator 6 changes and the percentage of time during each cycle that the output of the coincidence-gate phase comparator 2 is high decreases, noting FIG. 4(*c*). It may be recalled that the duration of each cycle that the coincidence-gate phase comparator 2 is low is fixed by the combined time delays $t_1$ and $t_2$. As shown in FIG. 4(*b*), the frequency of the output signal of the keyed astable multivibrator 6 increases until it has the same value as the frequency of the input signal. The average value of the signal appearing across the capacitor $C_3$ in this instance is shown by the dotted line in FIG. 4(*c*).

In a manner similar to that described hereinabove, if the input signal decreases in frequency, the phase relationship between the input signal and the output signal of the keyed astable multivibrator 6 changes such that the percentage of time during each cycle that the output of the coincidence-gate phase comparator 2 is high increases. The frequency of the output signal of the keyed astable multivibrator 6 therefore decreases.

In a typical FM section of a television circuit in accordance with the present invention which provides a bandwidth of greater than 600 megahertz at a center frequency of 4.5 magahertz, component values may be as listed below.

| | |
|---|---|
| $R_1$—3K ohms | $R_{11}$—1K ohms |
| $R_2$—300 ohms | $R_{12}$—1K ohms |
| $R_3$—2K ohms | $C_1$—4.7 picofarads |
| $R_4$—10K ohms | $C_2$—4.7 picofarads |
| $R_5$—2K ohms | $C_3$—0.01 microfarads |
| $R_6$—2K ohms | $t_1$—approximately 50 nanoseconds |
| $R_7+R_8$—25K ohms | $t_2$—approximately 17 nanoseconds |
| $R_9$—4.7K ohms | B+—8 volts |
| $R_{10}$—4.7K ohms | |

What is claimed is:

1. A phase-lock loop circuit comprising:

phase comparator means including a first input terminal means for receiving an input signal, a second input terminal means for receiving a signal of the same frequency as the input signal but phase-displaced therefrom, and an output terminal means, said phase comparator means being operable to compare the signals received at the first and second input terminal means and to produce and output signal at the output terminal means having a first condition when the compared signals bear a predeterminined first signal level relationship to each other and a second condition when the compared signals bear a different signal level relationship to each other; and keyed oscillator means coupled between said output terminal means and said second input terminal means having a delay of predetermined duration, said keyed oscillator means receiving output signals from the phase comparator means and being operable to provide an output signal to said second input terminal means delayed from a corresponding output signal from the phase comparator means by the predetermined duration and of the same frequency as said input signal but phase-displaced therefrom;

whereby said phase comparator means compares said input signal and the output signal of said keyed oscillator means and provides output signals at said output terminal means each having a first condition for the duration of time determined substantially by said delay in the keyed oscillator means, and having a second condition for a period of time dependent on the degree of phase displacement between the input signal and the output signal of said keyed oscillator means.

2. A phase-lock loop circuit in accordance with claim 1 wherein said phase comparator means comprises:

transistor means having a first input electrode connected to said first input terminal means for receiving said input signal, and a second input electrode connected to said second input terminal means for receiving said output signal from said keyed oscillator means; and biasing means for biasing said transistor means in a first conducting condition when said input signal and said keyed oscillator output signal have said second condition and in a second conducting condition when said input signal or said keyed oscillator output signal has said first condition.

3. A phase-lock loop circuit in accordance with claim 2 wherein said transistor means includes (a) an input transistor having a first emitter electrode, a second emitter electrode, a collector electrode, and a base electrode coupled to said biasing means, said first and second input electrodes of said transistor means being constituted by the first and second emitter electrodes of said input transistor, respectively; and (b) an inverting transistor circuit means connected to the collector electrode of said input transistor and to said biasing means and operable to invert signals applied thereto from said collector electrode in response to signals being applied to said first and second emitter electrodes.

4. A phase-lock loop circuit in accordance with claim 3 wherein said keyed oscillator means is an astable multivibrator including:

first transistor means coupled to the second input terminal means of said phase comparator means and operable in a first state of conduction;

second transistor means operable in a second state of conduction; and means responsive to the transition of the output of said phase comparator means from second condition to said first condition to reverse the conducting states of said first and second transistor means whereby an output signal is applied to said second input terminal means by said first transistor means, said reversal in the conducting states of said first and second transistor means taking place at a time after receiving an output from said phase comparator mean equal to said delay of said predetermined duration.

5. A phase-lock loop circuit in accordance with claim 4 further including:

emitter follower circuit means connected between the output terminal means of said phase comparator means and said keyed oscillator means for providing a low impedance to said keyed oscillator means.

6. A phase-lock loop FM detector circuit comprising:

phase comparator means including a first input terminal means for receiving an FM input signal, a second input terminal means for receiving a signal of the same frequency as the FM input signal but phase-displaced therefrom, and an output terminal means, said phase comparator means being operable to compare the signals received at the first and second input terminal means and to produce an output signal at the output terminal means having a first condition when the compared signals bear a predetermined first signal level relationship to each other and a second condition when the compared signals bear a different signal level relationship to each other; and keyed oscillator means coupled between said output terminal means and said second input terminal means having a delay of a predetermined duration, said keyed oscillator means receiving output signals from the phase comparator means and being operable to provide an output signal to said second input terminal means delayed from a corresponding output signal from the phase comparator means by the predetermined duration and of the same frequency as said FM input signal but phase-displaced therefrom;

whereby said phase comparator means compares said FM input signal and the output signal of said keyed oscillator means and provides output signals at said output terminal means each having a first condition for a duration of time determined substantially by said delay in the keyed oscillator means, and having a second condition for a period of time dependent on the degree of phase displacement between the input signal and the output signal of said keyed oscillator means; and integrator means coupled to the output terminal means of said phase compartor means for integrating the output signals of said phase comparator means thereby providing a detected output which is a replica of the frequency modulation on the input signal.

7. A phase-lock loop FM detector circuit in accordance with claim 6 wherein said phase comparator comprises:

transistor means having a first input electrode connected to said first input terminal means for receiving said input signal, a second input electrode connected to said second input terminal means for receiving said output signal from said keyed oscillator means; and biasing means for biasing said transistor means in a first conducting condition when said input signal and said keyed oscillator output signal have said second condition and in a second conducting condition when said input signal or said keyed oscillator output signal has said first condition.

8. A phase-lock loop FM detector circuit in accordance with claim 7 wherein said transistor means includes (a) an input transistor having a first emitter electrode, a second emitter electrode, a collector electrode, and a base electrode coupled to said biasing means, said first and second input electrodes of said transistor means being constituted by the first and second emitter electrodes of said input transistor, respectively; and (b) an inverting transistor circuit means connected to the collector electrode of said input transistor and to said biasing means and operable to invert signals applied thereto from said collector electrode in response to signals being applied to said first and second emitter electrodes.

9. A phase-lock loop FM detector circuit in accordance with claim 8 wherein said keyed oscillator means is an astable multivibrator including:

first transistor means coupled to the second input terminal means of said phase comparator and operable in a first state of conduction;

second transistor means operable in a second state of conduction; and means responsive to the transition of the output of said phase comparator means from said second condition to said first condition to reverse the conducting states of said first and second transistor means whereby an output signal is applied to said input terminal means by said first transistor means, said reversal in the conducting states of said first and second transistor means taking place at a time after receiving an output from said phase comparator means equal to said delay of said predetermined duration.

10. A phase-lock loop FM detector circuit in accordance with claim 9 further including:

emitter follower circuit means connected between the output terminal means of said phase comparator means and said keyed oscillator means for providing a low impedance to said keyed oscillator means.

References Cited

UNITED STATES PATENTS

| | | | |
|---|---|---|---|
| 3,111,625 | 11/1963 | Crafts | 329—122 X |
| 3,142,806 | 7/1964 | Fernandez | 329—122 X |
| 3,233,125 | 2/1966 | Buie. | |

OTHER REFERENCES

Hatke: "Automatic Phase Lock Stereo Multiplex Detector," March 1964, R.C.A. TN No. 575.

Sylvania Brochure, received U.S. Pat. Off. Feb. 5, 1965, 4 pages.

ALFRED L. BRODY, Primary Examiner

U.S. Cl. X.R.

307—233, 299; 325—419; 329—103; 331—25, 27